(12) United States Patent
Park (10) Patent No.: US 8,466,002 B2
(45) Date of Patent: Jun. 18, 2013

(54) METHODS OF MANUFACTURING A SOLAR CELL

(75) Inventor: Rae-Man Park, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/348,660

(22) Filed: Jan. 12, 2012

(65) Prior Publication Data

US 2012/0220073 A1    Aug. 30, 2012

(30) Foreign Application Priority Data

Feb. 28, 2011 (KR) .................. 10-2011-0017950
Nov. 25, 2011 (KR) .................. 10-2011-0124421

(51) Int. Cl.
*H01L 21/00* (2006.01)

(52) U.S. Cl.
USPC .................. 438/98; 438/93; 438/95

(58) Field of Classification Search
USPC ....................................... 438/93–98
See application file for complete search history.

(56) References Cited

U.S. PATENT DOCUMENTS

2011/0017289 A1* 1/2011 Park et al. ............ 438/95
2012/0279556 A1* 11/2012 Choi ..................... 438/98

FOREIGN PATENT DOCUMENTS

KR    10-2011-0047714 A    5/2011

\* cited by examiner

*Primary Examiner* — Kevin M Picardat
(74) *Attorney, Agent, or Firm* — Rabin & Berdo, P.C.

(57) ABSTRACT

Provided are methods of fabricating a solar cell and a vacuum deposition apparatus used therefor. The method may include forming a lower electrode on a substrate, forming a light absorption layer on the lower electrode, forming a buffer layer on the light absorption layer, and forming a window electrode layer on the buffer layer. The forming of the buffer layer may include a deposition step of forming a cationic metal material and a diffusion step of diffusing an anionic non-metal material into the cationic metal material.

18 Claims, 9 Drawing Sheets

METHODS OF MANUFACTURING A SOLAR CELL

CROSS-REFERENCE TO RELATED APPLICATIONS

This U.S. non-provisional patent application claims priority under 35 U.S.C. §119 to Korean Patent Application Nos. 10-2011-0017950 and 10-2011-0124421, filed on Feb. 28, 2011 and Nov. 25, 2011, respectively, in the Korean Intellectual Property Office, the entire contents of which are hereby incorporated by reference.

BACKGROUND OF THE INVENTION

Embodiments of the inventive concepts relate to a method of fabricating a solar cell, more particularly, to methods of manufacturing a solar cell, in which a buffer layer is formed by vacuum evaporating technique.

Copper indium gallium selenide (CIGS) solar cells recently attracting a lot of interest exhibit good properties in terms of efficiency and stability (e.g., without no initial deterioration), compared with amorphous silicon solar cells, and thus, further research is being carried out to commercialize the CIGS solar cells. In addition, the CIGS solar cells achieve a specific power of about 100 W/kg that is definitely superior to the conventional silicon or GaAs solar cells of 20-40 W/kg. Furthermore, the CIGS solar cell of a single junction structure exhibits efficiency of about 20.3% that is substantially equivalent to the maximum efficiency, i.e., 20%, of the conventional silicon solar cell.

With all its advantages, there is a difficulty in fabricating the CIGS solar cells with high productivity. This is because there is no technology capable of continuously producing the CIGS solar cells. For example, the CIGS solar cells have been fabricated using a batch process requiring many manual tasks. A step of forming a buffer layer in a wet manner is a main reason for this difficulty. Despite its simplicity, the wet step cannot be continuously performed after or before a vacuum-required step, and this makes the fabricating process complex and time consuming Moreover, the wet step suffers from high cost for treating of waste matters. In this sense, a new method for forming the buffer layer is required to commercialize the CIGS solar cell.

In a conventional art, the buffer layer may be formed using a sputtering or co-deposition method. However, for the sputtering method, it is hard to form the buffer layer having good uniformity, because a sputtering target such as cadmium sulfide CdS, zinc sulfide ZnS or indium sulfide InS cannot be sputtered in chemical composition. The sputtering target is heated by heat generated from sputtering plasma. Sulfur (S) in the sputtering target has thermal conductivity different from other metallic elements (e.g., Cd, Zn, or In) of the sputtering target. This results in a serious reduction in reproducibility. For the co-deposition method, the formation of the buffer layer requires a step of evaporating a metal material at a temperature of 1200° C. or more, and thus, it is hard to supply a large amount of source material. As a result, it is hard to realize a solar cell having large area and high productivity.

SUMMARY

Embodiments of the inventive concepts provide a method of fabricating a solar cell capable of realizing a uniform mixing ratio between cationic and anionic materials in a buffer layer.

Other embodiments of the inventive concepts provide a fabricating method capable of increasing productivity of solar cells.

According to example embodiments of inventive concepts, a method of fabricating a solar cell may include forming a lower electrode on a substrate, forming a light absorption layer on the lower electrode, forming a buffer layer on the light absorption layer, and forming a window electrode layer on the buffer layer. The forming of the buffer layer may include a deposition step of forming a cationic metal material and a diffusion step of diffusing an anionic non-metal material into the cationic metal material.

In some embodiments, the method may further include before the diffusion step, a first thermal treatment of vaporizing the anionic non-metal material, and a second thermal treatment of thermally decomposing the anionic non-metal material into atoms or molecules. The second thermal treatment may be performed at a temperature higher than that of the first thermal treatment.

In some embodiments, the first thermal treatment may be performed in a temperature ranging from about 200° C. to about 300° C.

In some embodiments, the second thermal treatment may be performed in a temperature ranging from about 800° C. to about 900° C.

In some embodiments, the diffusion step may include a third thermal treatment of exposing and diffusing the anionic non-metal material into the cationic metal material.

In some embodiments, the third thermal treatment may be performed in a temperature ranging from about 200° C. to about 300° C.

In some embodiments, the cationic metal material may include at least one of zinc, indium, cadmium, or tin.

In some embodiments, the anionic non-metal material may be sulfur.

In some embodiments, the buffer layer has a thickness of about 50 nm or less.

According to example embodiments of inventive concepts, a method of fabricating a solar cell may include forming a lower electrode on a substrate, forming a light absorption layer on the lower electrode, forming a buffer layer on the light absorption layer, and forming a window electrode layer on the buffer layer. The buffer layer may be formed by a vacuum deposition process, in which a cationic metal material may be deposited using an anionic non-metal material as an ambient gas.

In some embodiments, the vacuum deposition method may include a sputtering step of forming the cationic metal material and a diffusion step of diffusing the anionic non-metal material into the cationic metal material.

In some embodiments, the method may further include before the diffusion step, a first thermal treatment of vaporizing the anionic non-metal material, and a second thermal treatment of thermally decomposing the anionic non-metal material into atoms or molecules, the second thermal treatment being performed at a temperature higher than that of the first thermal treatment.

In some embodiments, the first thermal treatment may be performed in a temperature ranging from about 200° C. to about 300° C.

In some embodiments, the second thermal treatment may be performed in a temperature ranging from about 800° C. to about 900° C.

In some embodiments, the diffusion step may include a third thermal treatment of exposing and diffusing the anionic non-metal material into the cationic metal material.

In some embodiments, the third thermal treatment may be performed in a temperature ranging from about 200° C. to about 300° C.

In some embodiments, the cationic metal material may include at least one of zinc, indium, cadmium, or tin.

In some embodiments, the anionic non-metal material may be sulfur.

BRIEF DESCRIPTION OF THE DRAWINGS

Example embodiments will be more clearly understood from the following brief description taken in conjunction with the accompanying drawings. FIGS. 1 through 9 represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1:
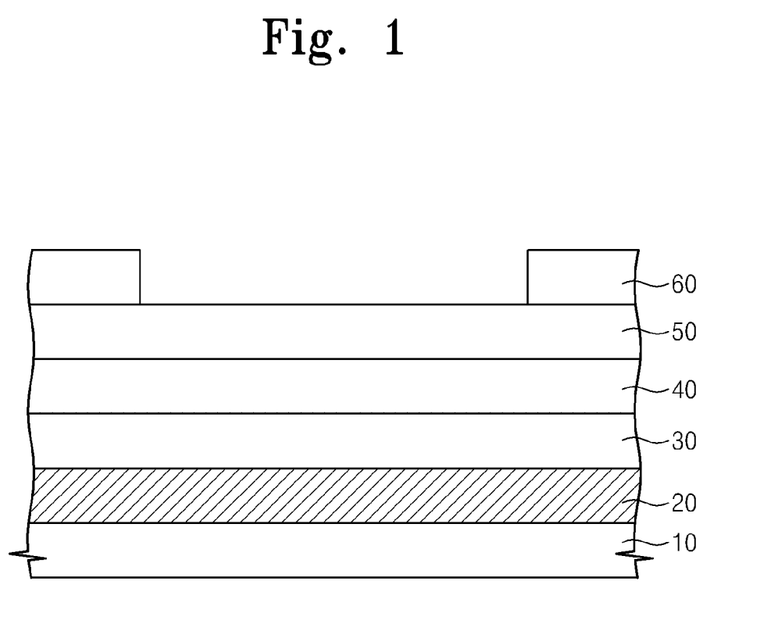
FIG. 1 is a sectional view of a solar cell according to example embodiment of the inventive concept.

FIG. 1 is a sectional view of a solar cell according to example embodiment of the inventive concept.

Referring to FIG. 1, a solar cell according to example embodiments of inventive concepts may include a light absorption layer 30, a buffer layer 40, and a window electrode layer 50 that are sequentially stacked on a substrate 10. The buffer layer 40 may include at least one of zinc sulfide, indium sulfide, cadmium sulfide, or tin sulfide. The buffer layer 40 may be configured to reduce a difference in energy bandgap between the light absorption layer 30 and the window electrode layer 50. In example embodiments, the buffer layer 40 may have a thickness of about 50 nm or less.

The light absorption layer 30 may be configured to generate electricity from a light using a photo-voltaic effect. The light absorption layer 30 may include one selected from chalcopyrite compound semiconductors including CuInSe, $CuInSe_2$, CuInGaSe, and $CuInGaSe_2$. In example embodiments, the chalcopyrite compound semiconductor may serve as a p-type semiconductor having an energy bandgap of about 1.2 eV.

The window electrode layer 50 may be a n-type transparent metal layer and include a layer of indium tin oxide (ITO) or zinc oxide. A lower electrode layer 20 may be provided below the light absorption layer 30 or between below the light absorption layer 30 and the substrate 10. The lower electrode layer 20 may be formed of a material with low resistivity. Moreover, the lower electrode layer 20 may be formed of a material having a good adhesion property to a glass substrate, and thus, the lower electrode layer 20 may be prevented from being peeled from the substrate 10 by a difference in thermal expansion coefficient. For example, the lower electrode layer 20 may include an opaque metal layer (e.g., of molybdenum). In example embodiments, all of the lower electrode layer 20, the light absorption layer 30, the buffer layer 40, and the window electrode layer 50, which are stacked on the substrate 10, may be epitaxial layers formed by vacuum evaporation methods. The substrate 10 may be a soda-lime glass substrate or a flexible substrate.

Hereinafter, a method of fabricating a solar cell according to example embodiments of inventive concepts will be described with reference to FIGS. 2 through 8.

Figure 2:
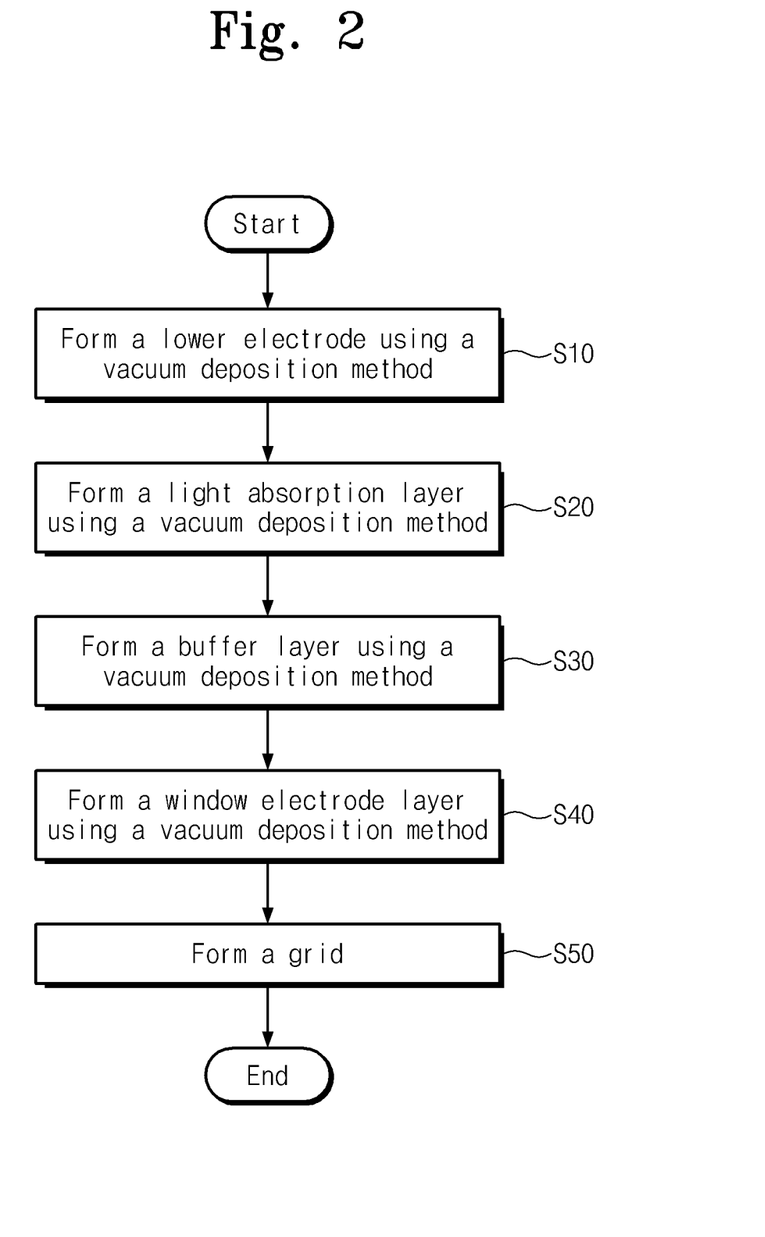
FIG. 2 is a flow chart illustrating a method of manufacturing a solar cell according to example embodiment of the inventive concept.

FIG. 2 is a flow chart illustrating a method of manufacturing a solar cell according to example embodiment of the inventive concept, and FIGS. 3 through 7 are sectional views illustrating a method of manufacturing a solar cell according to example embodiment of the inventive concept. FIG. 8 is a schematical sectional view of a vacuum deposition apparatus, which may be used to form a buffer layer of FIG. 1.

Figure 3:
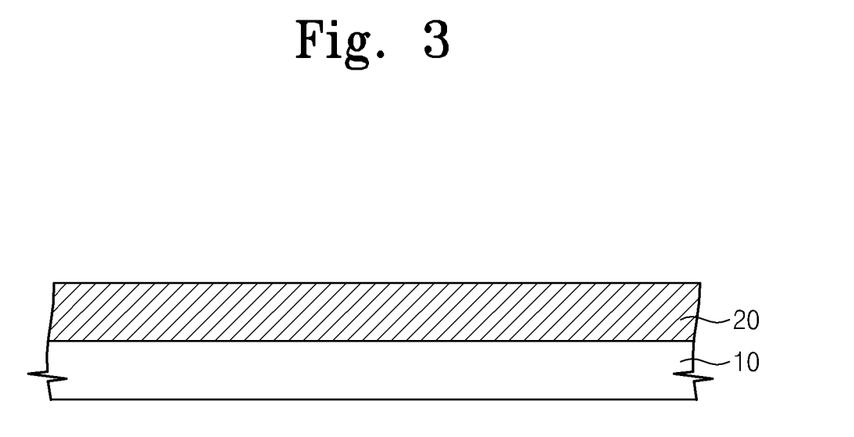
FIGS. 3 through 7 are sectional views illustrating a method of manufacturing a solar cell according to example embodiment of the inventive concept.

Referring to FIGS. 2 and 3, the lower electrode layer 20 may be formed on the substrate 10 (in S10). The lower electrode layer 20 may include a molybdenum layer formed by a vacuum deposition method, such as sputtering or evaporation. As the result of the use of molybdenum, the lower electrode layer 20 may have high electric conductivity, good ohmic contact resistance property with other layers, and good thermal stability (e.g., in a subsequent process performed under a selenium-containing atmosphere).

Figure 4:
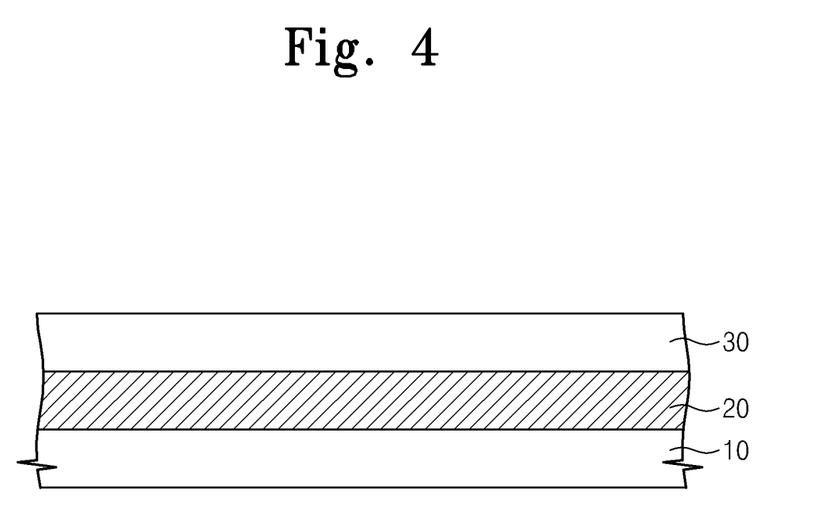

Referring to FIGS. 2 and 4, the light absorption layer 30 may be formed on the lower electrode layer 20 (in S20). The light absorption layer 30 may be formed by a vacuum deposition method, such as sputtering and co-deposition. The light absorption layer 30 may include one selected from chalcopyrite compound semiconductors including CuInSe, $CuInSe_2$, CuInGaSe, and $CuInGaSe_2$.

Figure 5:
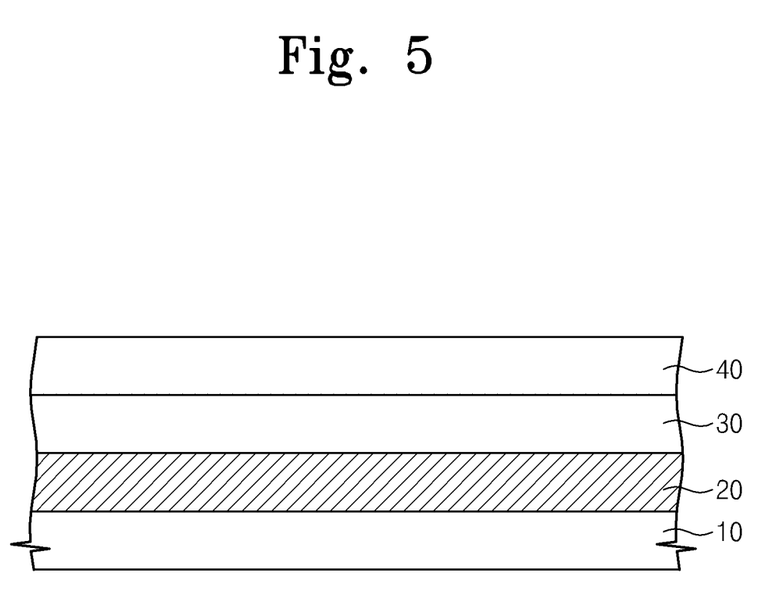

Referring to FIGS. 2 and 5, the buffer layer 40 may be formed by a vacuum deposition method (in S30). The buffer layer 40 may be formed of a material capable of reducing a difference in energy bandgap between the light absorption layer 30 and the window electrode layer 50. For example, a bandgap of the buffer layer 40 may be greater than that of the light absorption layer 30 and lower than that of the window electrode layer 50. In example embodiments, the buffer layer 40 may include at least one of zinc sulfide, cadmium sulfide, indium sulfide, or tin sulfide. In example embodiments, the buffer layer 40 may be formed of a metal sulfide that may be defined as a compound of sulfur and at least one metallic atom, which is electrically positive than sulfur. In example embodiments, the metal component may be formed by a physical vapor deposition method, such as sputtering. Sulfur, which is a non-metal element and is electrically negative, may be diffused in a metal layer by a thermal treatment. Sulfur may be diffused into a metal layer deposited on the lower electrode layer 20. Furthermore, sulfur may be used an ambient gas during a vacuum deposition process for forming a metallic element.

Referring to FIG. 8, a vacuum deposition apparatus 70 according to example embodiments of inventive concepts may include a chamber 72, a cathode 74, a susceptor 78, an anion gas supplier 80, and an anion molecule pyrolysis unit 82. The cathode 74 may be configured to perform a sputtering process on a target 76 including metallic elements, and for example, be applied with an external power of high frequency. The target 76 may be a sputtering source of cationic metallic material. The cathode 74 may serve as a sputter gun. The high frequency power may be used to induce a plasma reaction of an inert gas around the target 74.

The anion gas supplier 80 may be configured to supply a sulfur gas, which may serve as an anion element, into the chamber 10. Sulfur may be provided in a gas form by a first thermal treatment process. For example, the anion gas supplier 80 may include a first heater capable of heating the sulfur gas up to a temperature of about 200° C. to 300° C.

The anion molecule pyrolysis unit 82 may be configured to decompose the sulfur gas into an atomic or molecular state. For example, the anion molecule pyrolysis unit 82 may be configured to heat the sulfur gas up to a temperature of about 800° C. to 900° C. In example embodiments, the anion molecule pyrolysis unit 82 may include a second heater that is configured to perform a second thermal treatment process on the sulfur gas. The first and second thermal treatment processes may be performed before a deposition of sulfur, i.e., as a preliminary process.

The susceptor 78 may be configured to support the substrate 10. In example embodiments, the substrate 10 may be heated up to a temperature of about 200-300° C. by the susceptor 78. The sulfur gas may be uniformly diffused in a metal layer. The susceptor 78 may include a third heater configured to perform a rapid thermal treatment process. Accordingly, the vacuum deposition apparatus according to example embodiments of inventive concepts may be used to form a sulfur-containing metal layer or the buffer layer 40.

Figure 8:
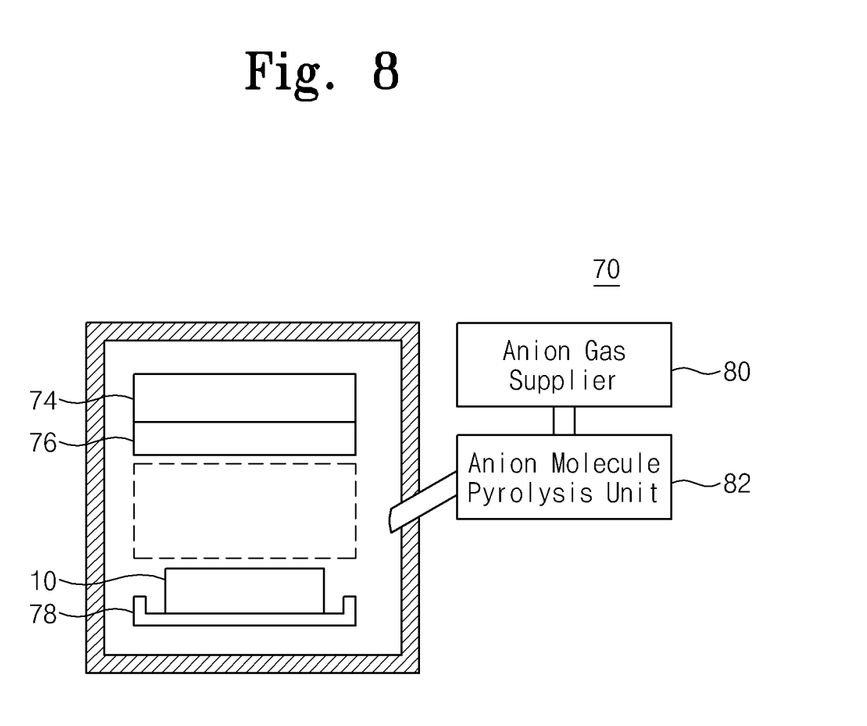
FIG. 8 is a schematical sectional view of a vacuum deposition apparatus, which may be used to form a buffer layer of FIG. 1.
Figure 9:
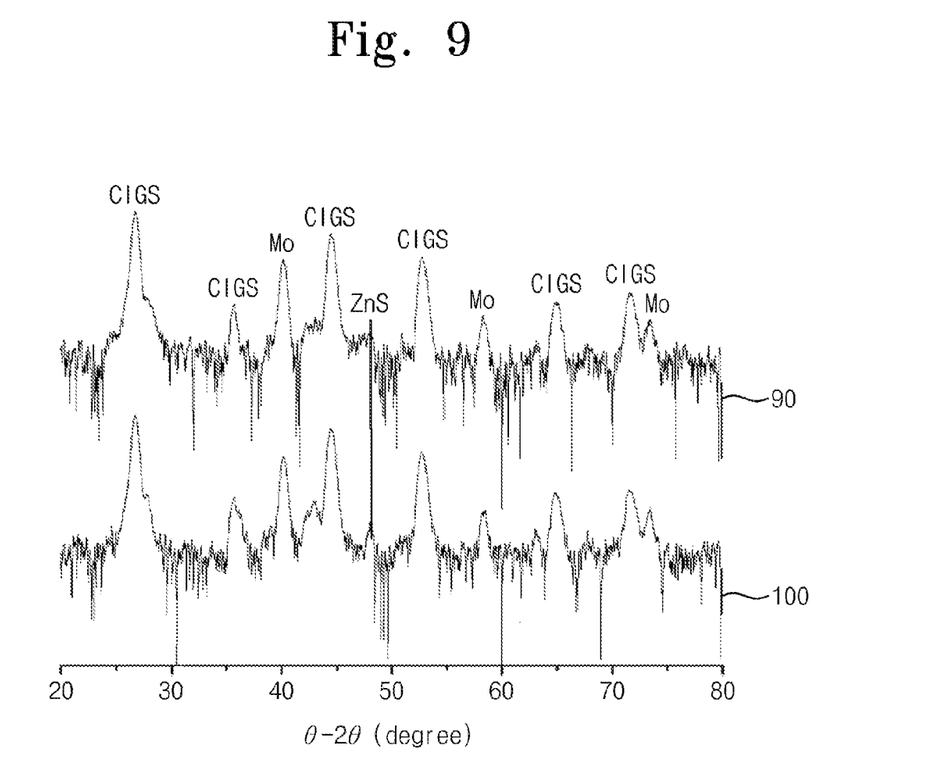
FIG. 9 shows an XRD graph from a buffer layer formed by the method according to example embodiments of inventive concept.

FIG. 9 is an XRD graph obtained from a sample containing a layer of zinc sulfide. The zinc sulfide layer of the sample was deposited on the light absorption layer 30 using the method described with reference to FIGS. 2 and 5, in the apparatus of FIG. 8. The zinc sulfide layer was formed. The reference numeral 90 represents a XRD result obtained from a structure, in which a light absorption layer and a conductive metal layer were provided on a substrate. In this structure, there were peaks of CIGS and Mo that correspond to the light absorption layer 30 and the lower electrode layer 20, respectively. The reference numeral 100 represents a XRD result obtained from a structure, in which a buffer layer of zinc sulfide, a light absorption layer and a conductive metal layer were provided on a substrate, and the buffer layer of zinc sulfide was prepared using the method according to example embodiments of inventive concepts. In this structure, there was a peak of zinc sulfide (ZnS) and this shows that the buffer layer 40 was effectively formed. In the graph, the horizontal axis records beam diffraction angles in degrees 2-theta in XRD analysis device and the vertical axis does an intensity of diffraction beam.

In this sense, the method of fabricating a solar cell according to example embodiments of inventive concepts can increase product yield and productivity of solar cells.

Figure 6:
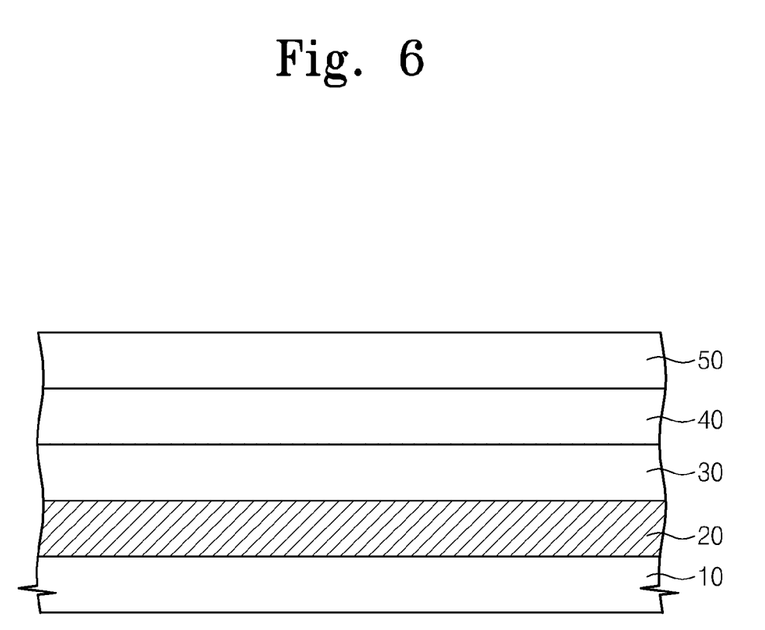

Referring to FIGS. 2 and 6, the window electrode layer 50 may be formed on the buffer layer 40. The window electrode layer 50 may include a layer of indium tin oxide or zinc oxide, which may be formed by a vacuum deposition method. The window electrode layer 50 may include a first metal oxide layer, a metal layer, and a second metal oxide layer. In example embodiments, the window electrode layer 50 may be formed by a physical vapor deposition method. In addition, the window electrode layer 50 may be formed to have a thickness ranging from about 70 nm to about 1.0 μm.

Figure 7:
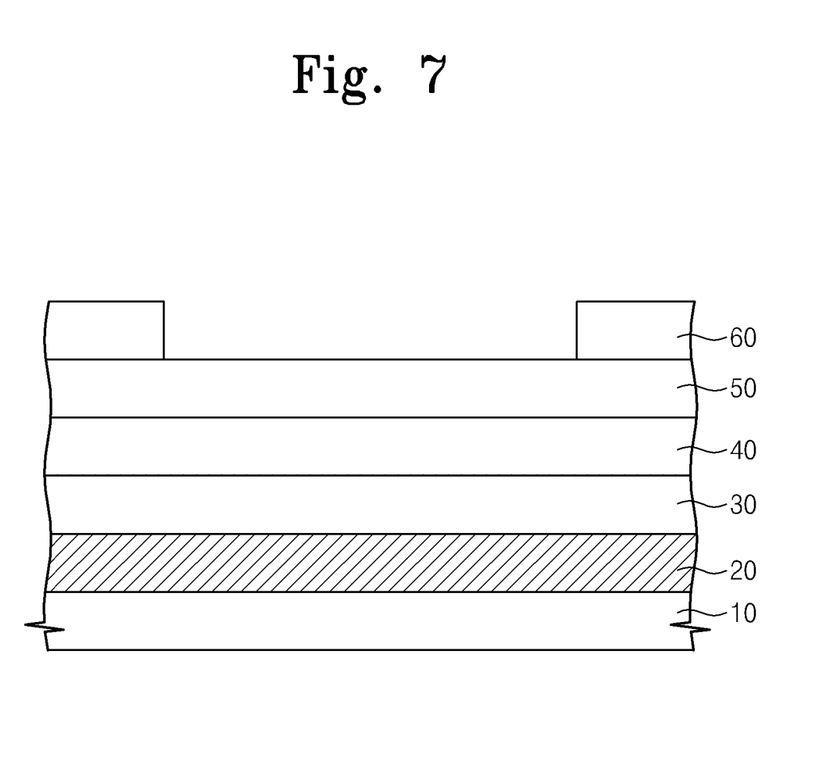

Referring to FIGS. 2 and 7, a grid 60 may be formed on the window electrodes 50. The grid 60 may include at least one metal layer (e.g., of gold, silver, aluminum, indium), which may be electrically connected to the window electrodes 40. The grid 60 may include a metallic mesh structure.

In the method of fabricating a solar cell according to example embodiments of inventive concepts, the lower electrode layer 20, the light absorption layer 30, the buffer layer 40, and the window electrode layer 50 may be formed using the vacuum deposition method, and this enable to increase productivity in a fabrication process.

According to example embodiments of inventive concepts, a buffer layer interposed between a light absorption layer and a window electrode layer may be formed using a vacuum deposition method. The vacuum deposition method of the buffer layer may include a vapor deposition step to form a cationic metallic material and a diffusion step to diffuse an anionic and non-metallic material into the cationic metal material. The anionic and non-metallic material may be provided in a gas form by a first thermal treatment process, and be thermally decomposed into atoms or molecules by a second thermal treatment process, and then, diffused into a metal layer deposited on a substrate by a third thermal treatment process. In example embodiments, the buffer layer may be one of sulfides, in which anionic and non-metallic elements are diffused in a cationic metal material.

Accordingly, the method of fabricating a solar cell according to example embodiments of inventive concepts can increase product yield and productivity of solar cells.

While example embodiments of the inventive concepts have been particularly shown and described, it will be understood by one of ordinary skill in the art that variations in form and detail may be made therein without departing from the spirit and scope of the attached claims.

What is claimed is:

1. A method of fabricating a solar cell, comprising:
    forming a lower electrode on a substrate;
    forming a light absorption layer on the lower electrode;
    forming a buffer layer on the light absorption layer; and
    forming a window electrode layer on the buffer layer,
    wherein the forming of the buffer layer comprises a deposition step of forming a cationic metal material and a diffusion step of diffusing an anionic non-metal material into the cationic metal material.

2. The method of claim 1, further comprising, before the diffusion step,
    a first thermal treatment of vaporizing the anionic non-metal material, and
    a second thermal treatment of thermally decomposing the anionic non-metal material into atoms or molecules, the second thermal treatment being performed at a temperature higher than that of the first thermal treatment.

3. The method of claim 2, wherein the first thermal treatment is performed in a temperature ranging from about 200° C. to about 300° C.

4. The method of claim 2, wherein the second thermal treatment is performed in a temperature ranging from about 800° C. to about 900° C.

5. The method of claim 1, wherein the diffusion step comprises a third thermal treatment of exposing and diffusing the anionic non-metal material into the cationic metal material.

6. The method of claim 5, wherein the third thermal treatment is performed in a temperature ranging from about 200° C. to about 300° C.

7. The method of claim 1, wherein the cationic metal material may include at least one of zinc, indium, cadmium, or tin.

8. The method of claim 2, wherein the anionic non-metal material is sulfur.

9. The method of claim 1, wherein the buffer layer has a thickness of about 50 nm or less.

10. A method of fabricating a solar cell, comprising:
    forming a lower electrode on a substrate;
    forming a light absorption layer on the lower electrode;
    forming a buffer layer on the light absorption layer; and
    forming a window electrode layer on the buffer layer,
    wherein the buffer layer is formed by a vacuum deposition process, in which a cationic metal material is deposited using an anionic non-metal material as an ambient gas.

11. The method of claim 10, wherein the vacuum deposition method comprises a sputtering step of forming the cationic metal material and a diffusion step of diffusing the anionic non-metal material into the cationic metal material.

12. The method of claim 11, further comprising, before the diffusion step,
    a first thermal treatment of vaporizing the anionic non-metal material, and
    a second thermal treatment of thermally decomposing the anionic non-metal material into atoms or molecules, the second thermal treatment being performed at a temperature higher than that of the first thermal treatment.

13. The method of claim 12, wherein the first thermal treatment is performed in a temperature ranging from about 200° C. to about 300° C.

14. The method of claim 12, wherein the second thermal treatment is performed in a temperature ranging from about 800° C. to about 900° C.

15. The method of claim 12, wherein the diffusion step comprises a third thermal treatment of exposing and diffusing the anionic non-metal material into the cationic metal material.

16. The method of claim 15, wherein the third thermal treatment is performed in a temperature ranging from about 200° C. to about 300° C.

17. The method of claim 12, wherein the cationic metal material may include at least one of zinc, indium, cadmium, or tin.

18. The method of claim 12, wherein the anionic non-metal material is sulfur.

* * * * *